(12) United States Patent
Lin et al.

(10) Patent No.: US 6,958,276 B2
(45) Date of Patent: Oct. 25, 2005

(54) METHOD OF MANUFACTURING TRENCH-TYPE MOSFET

(75) Inventors: Chen Tang Lin, Hsinchu (TW); Ming Feng Wu, Hsinchu (TW); Chung Chih Yeh, Hsinchu (TW); Hsin Yen Chiu, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 34 days.

(21) Appl. No.: 10/817,569

(22) Filed: Apr. 1, 2004

(65) Prior Publication Data

US 2005/0074950 A1 Apr. 7, 2005

(30) Foreign Application Priority Data

Oct. 3, 2003 (TW) ............................ 92127526 A

(51) Int. Cl.[7] .......................................... H01L 21/336
(52) U.S. Cl. ...................... 438/270; 438/424; 438/445; 438/637; 438/700
(58) Field of Search ........................ 438/270, 424–425, 438/637–638, 700

(56) References Cited

U.S. PATENT DOCUMENTS

| | | | |
|---|---|---|---|
| 6,265,269 B1 | 7/2001 | Chen et al. | |
| 6,709,952 B2 * | 3/2004 | Lai et al. | 438/424 |
| 6,800,509 B1 * | 10/2004 | Lin et al. | 438/138 |
| 2004/0203223 A1 * | 10/2004 | Guo et al. | 438/637 |
| 2005/0074950 A1 * | 4/2005 | Lin et al. | 438/445 |

* cited by examiner

Primary Examiner—Dung A. Le
(74) Attorney, Agent, or Firm—Townsend and Townsend and Crew LLP

(57) ABSTRACT

In a method of manufacturing MOSFET devices, and particularly to the trench-type MOSFET devices, embodiments of the present invention provide methods of forming bottom oxide layers having uniform thickness on the bottom of the trenches and avoiding undesired damage in the partial semiconductor substrate near the top of the trenches. In one embodiment, a method for manufacturing a trench-type MOSFET comprises providing a semiconductor substrate and forming a trench on the semiconductor substrate; forming a first oxide layer on a bottom and sidewalls of the trench and on the semiconductor substrate; forming a bottom anti-reflective coating (BARC) layer in the trench to cover the first oxide layer; forming a photoresist layer on the bottom anti-reflective coating layer; removing the photoresist layer; removing the bottom anti-reflective coating layer; and removing the first oxide layer on the sidewalls of the trench to form a bottom oxide layer on the bottom of the trench.

20 Claims, 4 Drawing Sheets

METHOD OF MANUFACTURING TRENCH-TYPE MOSFET

CROSS-REFERENCES TO RELATED APPLICATIONS

This application claims priority from R.O.C. Patent Application No. 092127526, filed Oct. 3, 2003, the entire disclosure of which is incorporated herein by reference.

BACKGROUND OF THE INVENTION

The present invention relates to a method of manufacturing a Metal-Oxide Semiconductor Field Effect Transistor (MOSFET) device, and more particularly to a method of manufacturing a trench-type Metal-Oxide Semiconductor Field Effect Transistor (MOSFET) device.

Nowadays, trench-type MOSFET devices are broadly used in the semiconductor industry. The difference between the trench-type MOSFET device and the traditional MOSFET device is that the gate structure of the former is formed in the trench for minimizing the area of the MOSFET device, enhancing the density of the MOSFET device and preventing the on-resistance from increasing rapidly in a short time. However, thinning the gate oxide layer for enhancing the current drive renders the gate oxide layer more easily affected by the punch-through effect.

Generally speaking, in the exemplary fabrication of a trench-type MOSFET device, a pad oxide layer, a silicon nitride layer and a mask oxide layer are sequentially formed on a semiconductor substrate. After that, the photolithography process and the etching process will be performed on the semiconductor substrate to remove portions of the mask oxide layer, the silicon nitride layer, the pad oxide layer and the semiconductor substrate to form trenches on the semiconductor substrate. Finally, the polysilicon layer is deposited on the semiconductor substrate to form a gate electrode. However, as described above, the trench-type MOSFET device with thinner gate oxide layer is easily affected by the punch-through effect. Thus, in order to reduce the punch-through effect, a trench-type MOSFET device with a bottom-oxide layer is therefore developed. The detailed description of the fabrication of the trench-type MOSFET device with a bottom-oxide layer can be found in U.S. Pat. No. 6,265,269.

In the fabrication of MOSFET devices, because of the arrangements of circuits on the semiconductor substrate, the trenches are not distributed uniformly and formed densely and loosely in different districts on the semiconductor substrate. The photoresist will be formed on the semiconductor substrate with an obvious difference in thickness. The thickness of the bottom-oxide layers of different working devices will also be non-uniform at the bottom of trenches in the subsequent steps. In another aspect, the etching process performed for forming the bottom-oxide layer also generates undesired damage in the portion of semiconductor substrate near the top of the trench. As a result, wafer acceptance test (WAT) properties of the MOSFET device will be affected, so as to influence the trench-type MOSFET.

It is therefore desirable to provide a method of manufacturing trench-type MOSFET devices with bottom-oxide layers having uniform thickness in the trenches and to avoid undesired damage on the semiconductor substrate of the trench-type MOSFET device near the top of the trenches.

BRIEF SUMMARY OF THE INVENTION

The present invention is related to a method of manufacturing MOSFET devices, and particularly to the trench-type MOSFET devices. The present invention is capable of forming bottom oxide layers having uniform thickness on the bottom of the trenches and avoiding undesired damage in the partial semiconductor substrate near the top of the trenches.

In accordance with an aspect of the present invention, a method for manufacturing a trench-type MOSFET comprises providing a semiconductor substrate and forming a trench on the semiconductor substrate; forming a first oxide layer on a bottom and sidewalls of the trench and on the semiconductor substrate; forming a bottom anti-reflective coating (BARC) layer in the trench to cover the first oxide layer; forming a photoresist layer on the bottom anti-reflective coating layer; removing the photoresist layer; removing the bottom anti-reflective coating layer; and removing the first oxide layer on the sidewalls of the trench to form a bottom oxide layer on the bottom of the trench.

In some embodiments, providing the semiconductor substrate and forming the trench comprises forming a pad oxide layer, a silicon nitride layer, and a mask oxide layer sequentially on the semiconductor substrate; and removing portions of the pad oxide layer, the silicon nitride layer, the mask oxide layer, and the semiconductor substrate to form the trench. Removing the portions is performed by a photolithography process and an etching process. After removing the portions, a sacrificial oxide layer may be formed on the sidewalls of the trench; and then removed. The sacrificial layer may be formed by thermal oxidation. The sacrificial oxide layer may be removed by etching.

In specific embodiments, the first oxide layer is formed by chemical vapor deposition (CVD). The bottom anti-reflective layer is formed by deposition. The bottom anti-reflective layer is removed by etching, desirably using a chemical compound which contains sulfuric acid. The first oxide layer is removed by etching, desirably using a chemical compound which contains hydrofluoric acid. The method may further comprise depositing a polysilicon layer in the trench after removing the first oxide layer on the sidewalls of the trench.

DETAILED DESCRIPTION OF THE INVENTION

Embodiments of the present invention provide a method of manufacturing a MOSFET applied to a trench-type MOSFET device. The method prevents the bottom oxide layer from forming non-uniformly and avoids undesired damage near the top of the trench due to the pattern-density distribution of the trenches on the semiconductor substrate. The method also keeps the properties of wafer acceptance test (WAT) from the effect of the traditional disadvantage.

The present invention will now be described with reference to the following exemplary embodiments. It is to be noted that the following descriptions including device types, dimensions, materials, functionally-equivalent processes or steps do not limit the protective scope of the present invention. The scope of the present invention is defined in the claims.

Figure 1A:
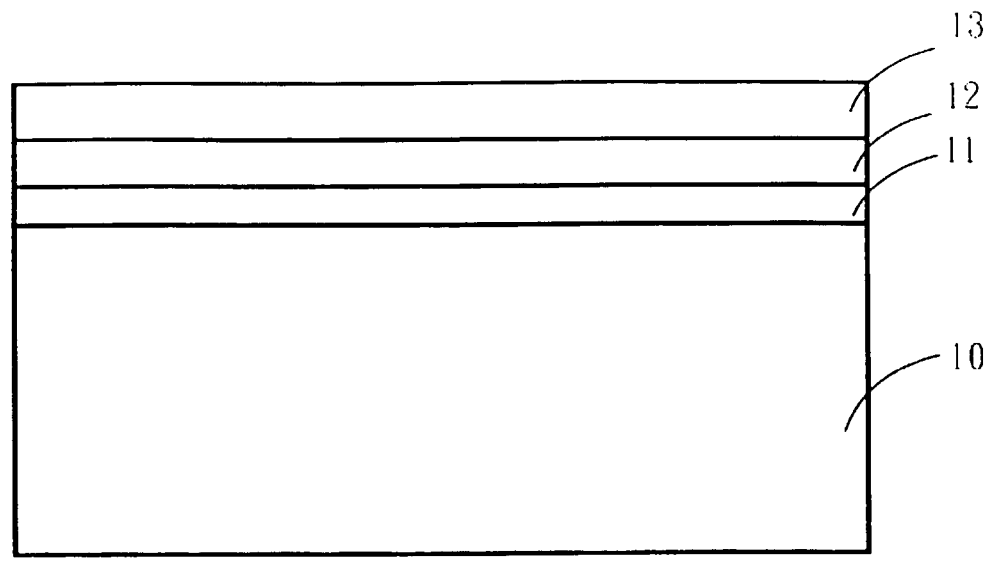
FIG. 1(a) to FIG. 1(h) are the schematic cross-sectional views illustrating the process of manufacturing a trench-type MOSFET device according to an exemplary embodiment of the present invention.
Figure 1B:
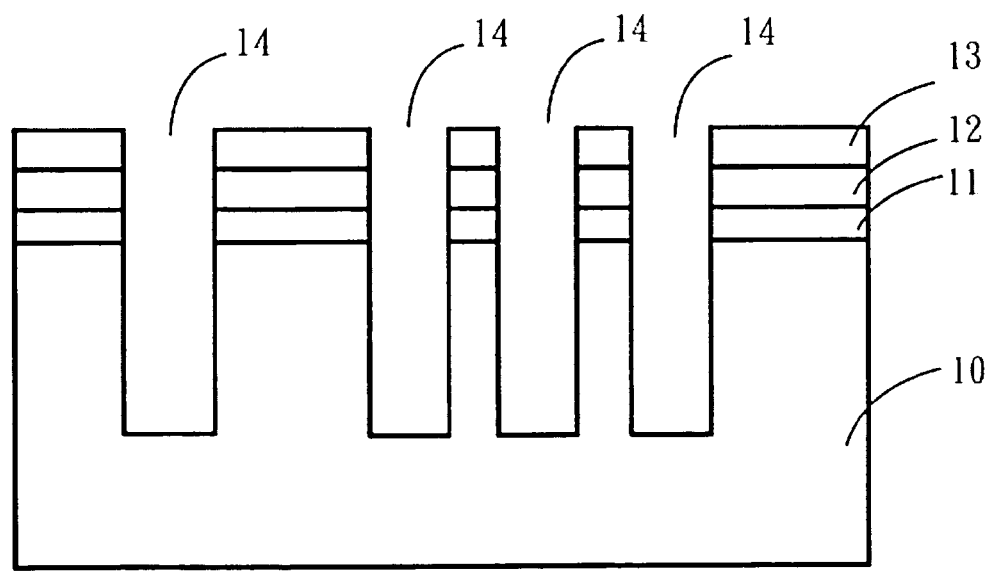

FIG. 1(a) to FIG. 1(h) are the schematic cross-sectional views illustrating the process of manufacturing a trench-type MOSFET device according to one embodiment of the present invention. As shown in FIG. 1(a), a semiconductor substrate 10, i.e. silicon substrate or glass substrate, is first provided to manufacture a trench-type MOSFET device. Then, the pad oxide layer 11, the silicon nitride layer 12 and the mask oxide layer 13 are sequentially formed on the semiconductor substrate 10. Usually, the pad oxide layer 11 serves as a buffer to reduce the stress between the semiconductor substrate 10 and silicon nitride layer 12, and the mask oxide layer 13 is preferably a silicon oxide layer. Then, as shown in FIG. 1(b), portions of the mask oxide layer 13, the silicon nitride layer 12, the pad oxide layer 11 and the semiconductor substrate 10 are removed by the photolithography process and etching process to form trenches 14 having the depth of about 1.51 $\mu$m to 2.5 $\mu$m and the width of about 0.5 $\mu$m on the semiconductor substrate 10.

In the fabrication, if the trenches 14 were formed by the etching process, undesired particles may be formed on the bottom or the sidewalls of the trenches 14. At the same time, non-planar surface also would be formed on the semiconductor substrate 10. Therefore, in order to solve this problem, after the trenches 14 are formed, a sacrifice oxide layer may be preferably formed by thermal oxidation process (not shown) on the semiconductor substrate 10 and into the trenches 14, and then be removed (usually for about 500 Å in thickness).

Figure 1C:
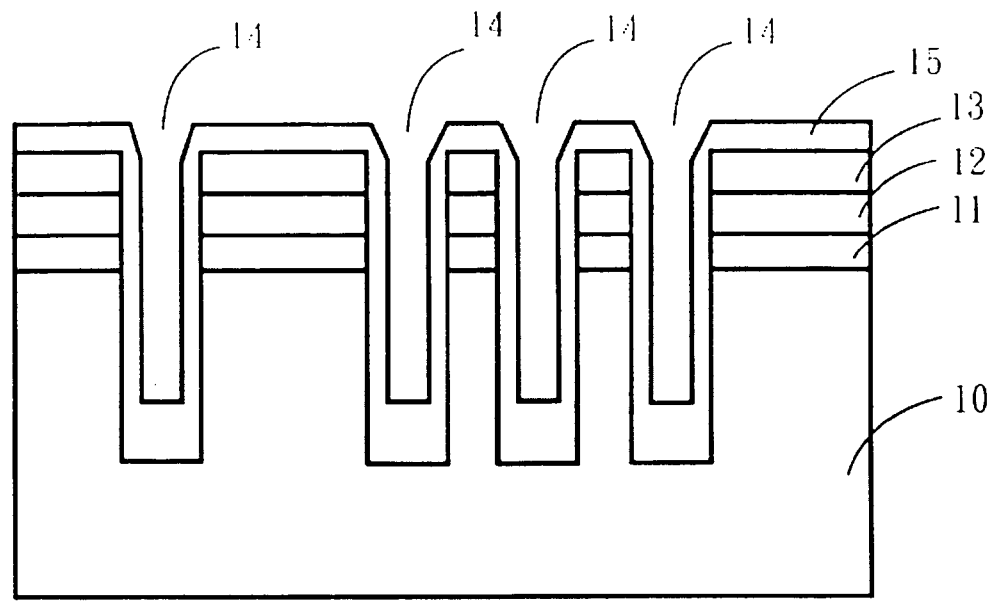
Figure 1D:
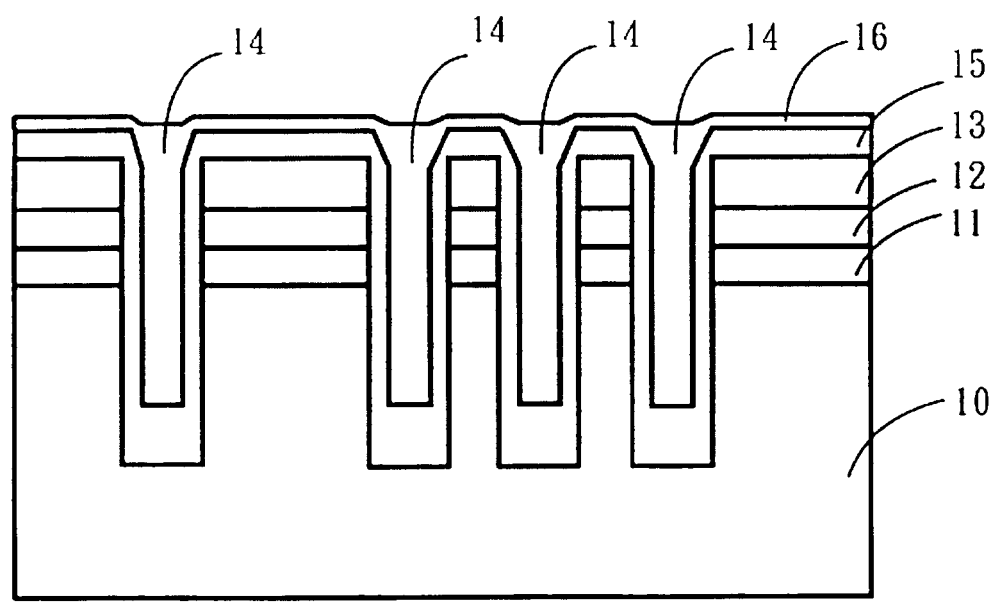
Figure 1E:
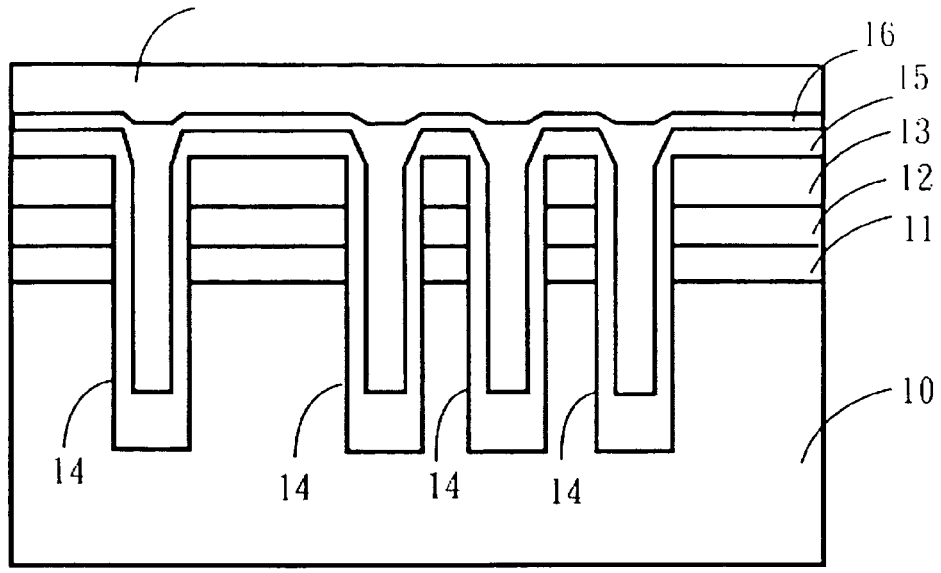
Figure 1F:
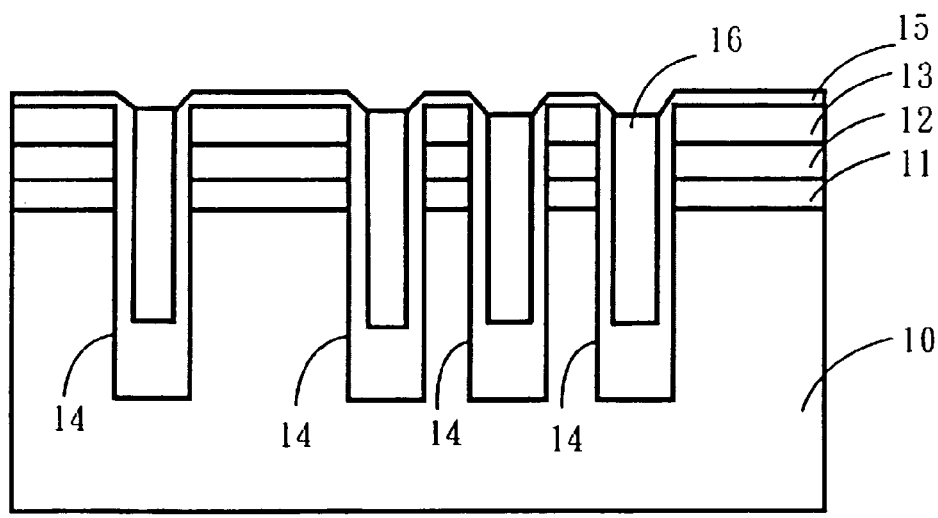
Figure 1G:
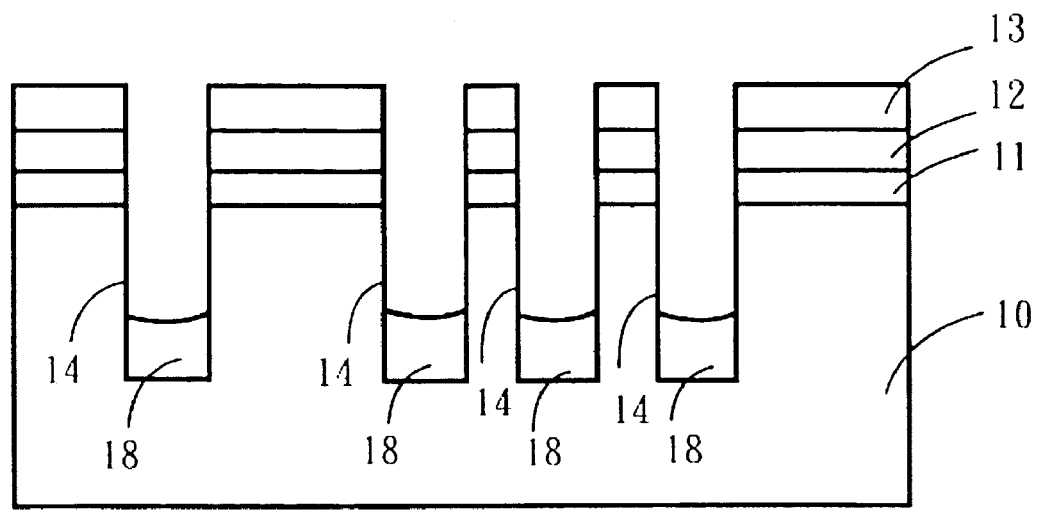

After that, as shown in FIG. 1(c), an oxide layer 15 is formed on the bottom and the sidewalls of trench 14 and the semiconductor substrate 10 by a vapor deposition process (preferably a chemical vapor deposition process). As shown in FIG. 1(d), a bottom anti-reflective coating layer 16 is formed into the trench 14 and covers the oxide layer 15. Because of the low viscosity resulting in high flow rate, the bottom anti-reflective coating layer 16 is formed on the semiconductor substrate 10 and fills the trench 14 with formation of a thin film. The bottom anti-reflective coating layer 16 will be formed with a more planar surface on the semiconductor substrate 10 as shown in FIG. 1(d). As seen in FIG. 1(e), because the bottom anti-reflective coating layer 16 has a more planar surface on the semiconductor substrate 10, the photoresist layer 17 is formed uniformly on the semiconductor substrate 10 without the effect of the pattern-density distribution of the trenches 14 on the semiconductor substrate 10. Thus, the photoresist layer 17 will not be formed with an obvious difference in thickness as in prior processes. As shown in FIG. 1(f), when the photoresist layer 17 is then removed, the conventional undesired damage will not occur at the corner of the trench 14 on the semiconductor substrate 10. Subsequently, as shown in FIG. 1(g), the bottom anti-reflective coating layer 16 is removed by an etching process (preferably a wet etching process) with the chemical compound containing a sulfuric acid. Then, the oxide layer 15 on the sidewalls of the trench 14 is also removed by an etching process (preferably a wet etching process) with the chemical compound containing a hydrofluoric acid. Afterwards, the bottom oxide layer 18 will be formed on the bottom of the trench 14.

Figure 1H:
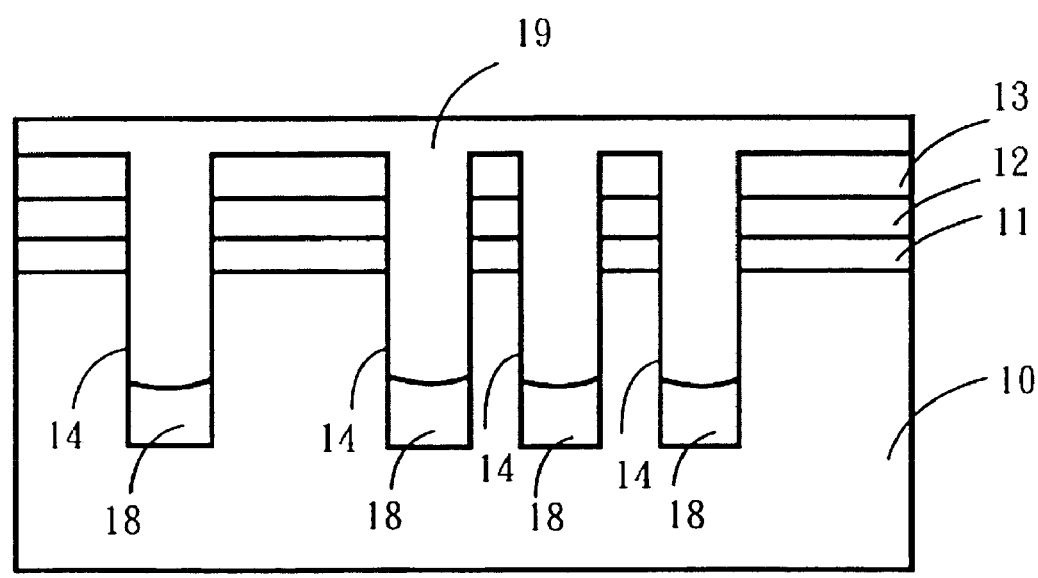

Finally, as shown in FIG. 1(h), a conductive material 19, i.e. polysilicon, is deposited on the semiconductor substrate 10 and into the trench 14, and essential polished processes may be performed to continue the subsequent process of manufacturing the trench-type MOSFET device.

In the present embodiment, because the bottom anti-reflective coating layer (BARC) is formed on the semiconductor substrate before the photoresist layer is formed, the trenches are filled with the bottom anti-reflective coating layer (BARC), and the semiconductor substrate has a thin film. The photoresist layer will be formed uniformly without the effect of the pattern-density distribution of the trenches. Further, when the photoresist layer is removed by the etching process, the mentioned undesired damage on the top and the sidewalls of the trench will not occur anymore by the effect of the pattern-density distribution of the trenches as in the conventional approach. Moreover, because of the bottom anti-reflective coating layer (BARC), after the photoresist layer is removed, portion of uniform bottom anti-reflective coating layer (BARC) will remain in the trenches. Therefore, the bottom oxide layer will be formed uniformly on the bottom of each trench and has specific thickness after the bottom anti-reflective coating layer and the oxide layer in the trenches are removed by etching process in the sequential process without the effect of the pattern-density distribution of the trenches.

To sum up, the present embodiment employs the bottom anti-reflective coating layer formed on the whole semiconductor substrate and into the trench before the photoresist layer is formed and utilizes the properties of low viscosity and high flow rate of the bottom anti-reflective coating layer to form a thin film on the semiconductor substrate 10. Therefore, the photoresist layer will not be formed with different thickness but will be formed uniformly on the semiconductor substrate without the effect of the pattern-density distribution of the trenches. Thereby, after the uniform photoresist layer is removed, the conventional undesired damage on the top and the sidewalls of the trench will not occur anymore. Furthermore, the bottom oxide layer will be formed uniformly on the bottom of each trench after coating the bottom anti-reflective coating layer, and the oxide layer in the trench is removed by the etching process. Therefore, the present embodiment not only avoids damage in the traditional trench-typed MOSFET but also prevents the bottom oxide layer from forming with non-uniform thickness.

While the invention has been described in terms of what is presently considered to be the most practical and preferred embodiments, it is to be understood that the invention needs not be limited to the disclosed embodiment. On the contrary, it is intended to cover various modifications and similar arrangements include within the spirit and scope of the appended claims which are to accord with the broadest interpretation so as to encompass all such modification and similar structures.

What is claimed is:

1. A method for manufacturing a trench-type MOSFET, the method comprising:

providing a semiconductor substrate and forming a trench on the semiconductor substrate;

forming a first oxide layer on a bottom and sidewalls of the trench and on the semiconductor substrate;

forming a bottom anti-reflective coating (BARC) layer in the trench to cover the first oxide layer;

forming a photoresist layer on the bottom anti-reflective coating layer;

removing the photoresist layer;

removing the bottom anti-reflective coating layer; and removing the first oxide layer on the sidewalls of the trench to form a bottom oxide layer on the bottom of the trench.

2. The method of claim 1 wherein providing the semiconductor substrate and forming the trench comprises:
   forming a pad oxide layer, a silicon nitride layer, and a mask oxide layer sequentially on the semiconductor substrate; and
   removing portions of the pad oxide layer, the silicon nitride layer, the mask oxide layer, and the semiconductor substrate to form the trench.

3. The method of claim 2 wherein removing the portions is performed by a photolithography process and an etching process.

4. The method of claim 2 further comprising after removing the portions:
   forming a sacrificial oxide layer on the sidewalls of the trench; and
   removing the sacrificial oxide layer.

5. The method of claim 4 wherein the sacrificial layer is formed by thermal oxidation.

6. The method of claim 4 wherein the sacrificial oxide layer is removed by etching.

7. The method of claim 1 wherein the first oxide layer is formed by chemical vapor deposition (CVD).

8. The method of claim 1 wherein the bottom anti-reflective layer is formed by deposition.

9. The method of claim 1 wherein the bottom anti-reflective layer is removed by etching.

10. The method of claim 9 wherein the bottom anti-reflective layer is removed by etching using a chemical compound which contains sulfuric acid.

11. The method of claim 1 wherein the first oxide layer is removed by etching.

12. The method of claim 11 wherein the first oxide layer is removed by etching using a chemical compound which contains hydrofluoric acid.

13. The method of claim 1 further comprising depositing a polysilicon layer in the trench after removing the first oxide layer on the sidewalls of the trench.

14. A method for manufacturing semiconductor devices, the method comprising:
   providing a semiconductor substrate having a trench on the semiconductor substrate;
   forming a first oxide layer on a bottom and sidewalls of the trench and on the semiconductor substrate;
   forming a bottom anti-reflective coating (BARC) layer in the trench to cover the first oxide layer;
   forming a photoresist layer on the bottom anti-reflective coating layer; and
   removing the photoresist layer, the bottom anti-reflective coating layer, and the first oxide layer on the sidewalls of the trench to form a bottom oxide layer on the bottom of the trench.

15. The method of claim 14 wherein providing the semiconductor substrate having the trench comprises:
   forming a pad oxide layer, a silicon nitride layer, and a mask oxide layer sequentially on the semiconductor substrate; and
   removing portions of the pad oxide layer, the silicon nitride layer, the mask oxide layer, and the semiconductor substrate to form the trench.

16. The method of claim 15 further comprising after removing the portions:
   forming a sacrificial oxide layer on the sidewalls of the trench; and
   removing the sacrificial oxide layer.

17. The method of claim 15 further comprising depositing a polysilicon layer in the trench after removing the first oxide layer on the sidewalls of the trench.

18. A method for manufacturing semiconductor devices, the method comprising:
   providing a semiconductor substrate having a trench on the semiconductor substrate;
   forming a first oxide layer on a bottom and sidewalls of the trench and on the semiconductor substrate;
   forming a bottom anti-reflective coating (BARC) layer over the first oxide layer, the bottom anti-reflective coating layer filling the trench;
   forming a photoresist layer on the bottom anti-reflective coating layer; and
   removing the photoresist layer, the bottom anti-reflective coating layer, and the first oxide layer on the sidewalls of the trench to form a bottom oxide layer on the bottom of the trench.

19. The method of claim 18 wherein providing the semiconductor substrate having the trench comprises:
   forming a pad oxide layer, a silicon nitride layer, and a mask oxide layer sequentially on the semiconductor substrate;
   removing portions of the pad oxide layer, the silicon nitride layer, the mask oxide layer, and the semiconductor substrate to form the trench;
   forming a sacrificial oxide layer on the sidewalls of the trench; and
   removing the sacrificial oxide layer.

20. The method of claim 18 further comprising depositing a polysilicon layer in the trench after removing the first oxide layer on the sidewalls of the trench.

* * * * *